United States Patent
Briggs et al.

(10) Patent No.: US 9,837,350 B2
(45) Date of Patent: Dec. 5, 2017

(54) SEMICONDUCTOR INTERCONNECT STRUCTURE WITH DOUBLE CONDUCTORS

(71) Applicant: INTERNATIONAL BUSINESS MACHINES CORPORATION, Armonk, NY (US)

(72) Inventors: Benjamin D. Briggs, Waterford, NY (US); Takeshi Nogami, Schenectady, NY (US); Raghuveer R. Patlolla, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/097,033

(22) Filed: Apr. 12, 2016

(65) Prior Publication Data
US 2017/0294381 A1 Oct. 12, 2017

(51) Int. Cl.
*H01L 23/48* (2006.01)
*H01L 23/522* (2006.01)
*H01L 23/532* (2006.01)
*H01L 21/768* (2006.01)

(52) U.S. Cl.
CPC .... *H01L 23/5226* (2013.01); *H01L 21/76846* (2013.01); *H01L 21/76867* (2013.01); *H01L 21/76873* (2013.01); *H01L 21/76883* (2013.01); *H01L 23/53209* (2013.01); *H01L 23/53228* (2013.01); *H01L 23/53266* (2013.01)

(58) Field of Classification Search
CPC ... H01L 2224/13014; H01L 2224/0133; H01L 2224/3185; H01L 2224/13147; H01L 2224/11462; H01L 2224/13083; H01L 2224/13026; H01L 2224/11019; H01L 2224/13551; H01L 2224/13155; H01L 2224/13017; H01L 24/13; H01L 24/11
See application file for complete search history.

(56) References Cited

U.S. PATENT DOCUMENTS

| | | | |
|---|---|---|---|
| 5,592,023 A * | 1/1997 | Oda | H01L 23/5283 257/750 |
| 6,147,404 A | 11/2000 | Pramanick et al. | |
| 6,887,353 B1 | 5/2005 | Ding et al. | |
| 7,339,271 B2 | 3/2008 | Morrow et al. | |

(Continued)

OTHER PUBLICATIONS

List of IBM Patents or Patent Applications Treated as Related, U.S. Appl. No. 15/097,033, filed Apr. 12, 2016, 2 Pages.

(Continued)

*Primary Examiner* — (Vikki) Hoa B Trinh
(74) *Attorney, Agent, or Firm* — Cantor Colburn LLP; Vazken Alexanian

(57) ABSTRACT

Embodiments are directed to a semiconductor structure having a dual-layer interconnect and a barrier layer. The interconnect structure combines a first conductive layer, a second conductive layer, and a barrier layer disposed between. The result is a low via resistance combined with improved electromigration performance. In one embodiment, the first conductive layer is copper, the second conductive layer is cobalt, and the barrier layer is tantalum nitride. A barrier layer is not used in other embodiments. Other embodiments are also disclosed.

13 Claims, 8 Drawing Sheets

(56) References Cited

U.S. PATENT DOCUMENTS

| | | |
|---|---|---|
| 8,138,083 B2 | 3/2012 | Yang et al. |
| 8,288,276 B2 | 10/2012 | Yang et al. |
| 2003/0194857 A1 | 10/2003 | Hau-Riege et al. |
| 2007/0077761 A1 | 4/2007 | Lehr et al. |
| 2008/0157380 A1 | 7/2008 | Hong |

OTHER PUBLICATIONS

U.S. Appl. No. 15/609,672, filed May 31, 2017, "Semiconductor Interconnect Structure With Double Conductors".

* cited by examiner

SEMICONDUCTOR INTERCONNECT STRUCTURE WITH DOUBLE CONDUCTORS

BACKGROUND

The present disclosure relates in general to the field of semiconductor fabrication methodologies and resulting device structures. More specifically, the present disclosure relates to fabrication methodologies and resulting structures for a semiconductor device having a double layered copper interconnect structure.

Semiconductor devices include a plurality of circuit components (e.g., transistors, resistors, diodes, capacitors, etc.) connected together to form an integrated circuit formed on a semiconductor substrate. A complex network of semiconductor integrated circuit interconnects are routed to connect the circuit components distributed on the surface of the substrate. Efficient routing of these interconnects across semiconductor devices requires the formation of multi-level or multi-layered patterning schemes.

An interconnect structure includes metal vias that run perpendicular to the semiconductor substrate. The metal vias are disposed in trench areas. In addition, an interconnect structure includes metal lines that are disposed in the trench areas, wherein the trench areas are formed in a dielectric material. The metal vias are connected to the metal lines, and the metal lines run parallel to the semiconductor substrate.

Furthermore, an interconnect structure that is copper (Cu) based, when compared with an aluminum (Al) based interconnect structure, might provide higher speed signal transmission between large numbers of transistors on a complex semiconductor chip. Accordingly, when manufacturing integrated circuits, copper (i.e., a metal conductor) is typically used for forming the semiconductor integrated circuit's interconnects because of copper's low resistivity and high current carrying capacity. Resistivity is the measure of how much a material opposes electric current caused by a voltage being placed across the material. However, when copper is utilized to form interconnects, electromigration may occur. Electromigration is the gradual displacement of atoms of a metal conductor due to the high density of current passing through the metal conductor.

For high-speed and low-power operation, the resistance of a via should be low. In addition, the ability to block electromigration should be high. A material such as Tantalum Nitride (TaN) can be used as a barrier layer at the bottom of a via. When the TaN barrier layer is thinned down at the via bottom, the via resistance becomes low. However, that adversely affects the electromigration performance. This is due to no longer having what is called the "short length effect" or "blech length effect." This is when a copper line with electromigration blocking boundaries is of a sufficiently short length (between 1 to 10 micrometers) that the migrating copper atoms impinge on the blocking boundary creating a stress gradient backwards that prevents further migration of copper. It is desirable to have a blocking boundary layer that provides both low resistance and a high ability to block electromigration.

SUMMARY

Embodiments are directed to a semiconductor interconnect structure. The structure comprises a first conductive layer coupled to a dielectric, a second conductive layer, and a barrier layer disposed between the first conductive layer.

Embodiments are further directed to a method for forming a semiconductor interconnect structure. The method can comprise forming a first conductive layer in a recess of a dielectric layer and forming a second conductive layer disposed on the first conductive layer.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

Figure 1:
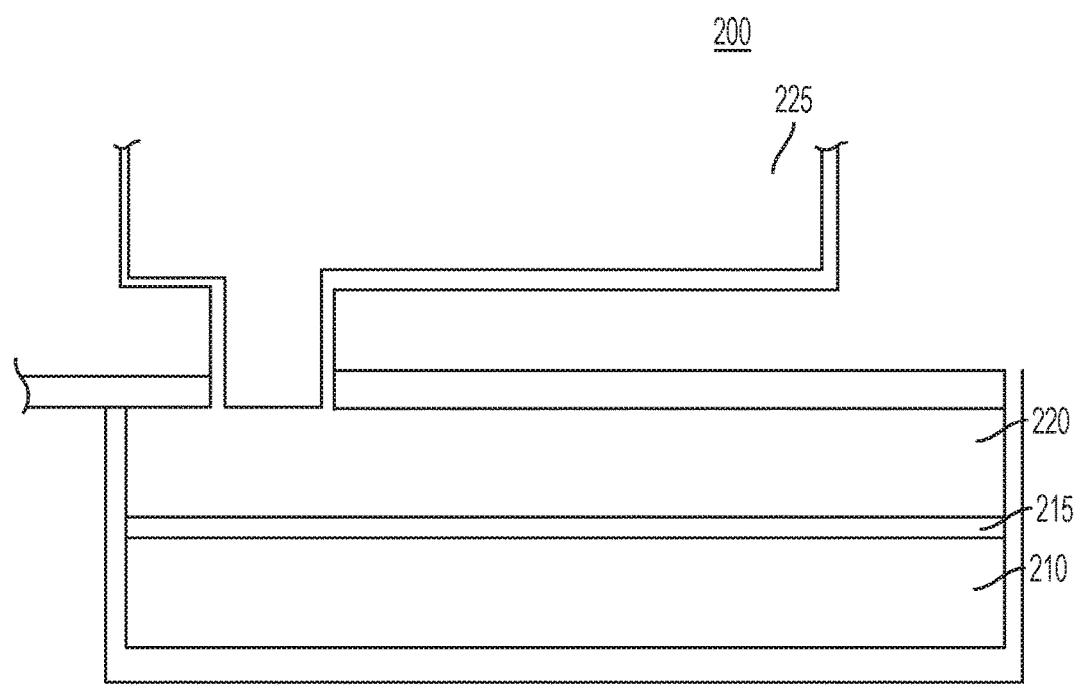
FIG. 1 depicts an exemplary double-layer interconnect with a barrier layer of an embodiment.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting. In the drawings, like numbering represents like elements.

DETAILED DESCRIPTION

Various embodiments of the present disclosure will now be described with reference to the related drawings. Alternate embodiments may be devised without departing from the scope of this disclosure. Various connections might be set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition it will be understood that when an element as a layer, region, or substrate is referred to as being "on" or "over", or "disposed on" another element, it can be directly on the other element or intervening elements may also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

For the sake of brevity, conventional techniques related to semiconductor device and integrated circuit fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based integrated circuits are well-known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of semiconductor devices and I according to the present disclosure utilize a variety of individually known physical and chemical processes performed on a semiconductor (e.g., silicon) substrate, some of which are described in the following immediately following paragraphs.

In general, the various processes used to form a microchip that will be packaged into an integrated circuit fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions or even billions of transistors can be built and wired together to form the complex circuitry of a modern microelectronic device.

Fundamental to the above-described fabrication processes is semiconductor lithography, i.e., the formation of three-dimensional relief images or patterns on the semiconductor substrate for subsequent transfer of the pattern to the substrate. In semiconductor lithography, the patterns are on a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present disclosure, the production of semiconductor integrated circuits and other microelectronic devices from semiconductor wafers requires formation of one or more metal layers on a wafer. These metal layers are used, for example, to electrically interconnect various devices of the integrated circuit. These metal layers may be, for example, nickel, tungsten, solder, and copper. These metals can be deposited using various different techniques such as, for example, chemical vapor deposition (CVD), physical vapor deposition (PVD), atomic layer deposition, electroplating, and electroless plating, and the like.

Prior to the formation of metal interconnects, a barrier layer might be formed in patterned structures such as, for example, vias, trenches or other features. The barrier layer is used to prevent movement of materials between the circuit patterns into an adjacent dielectric layer. The barrier layer is typically tantalum, or tantalum nitride, deposited into the vias and trenches by PVD or ALD processes. After the barrier layer is formed, a copper seed layer, for example, is deposited over the barrier layer and, thereafter, an electroplating process forms the copper interconnect layer.

An exemplary electromigration blocking boundary of the prior art had a barrier layer between a via and a metal layer. The thickness of the barrier layer presents a dilemma for semiconductor manufacturers. The via resistance might be high because of the presence of a TaN barrier 122 at the bottom of a via 120. The resistance of the via can be made lower by removing or thinning the TaN barrier layer. However, the TaN barrier layer should be thick enough such that it works as an electromigration blocking boundary. The flow of copper atoms, such as from a metal layer and via, can be blocked by an electromigration blocking boundary. Then the lower level (and upper level, since the blocking boundary works in both directions) metal can have a much longer electromigration lifetime than prior technology. So semiconductor manufacturers have to balance the thickness of the barrier layer between being thick enough to perform well as an electromigration blocking boundary while being thin enough to present a low via resistance.

Embodiments disclosed herein address the above-described shortcomings. In some embodiments, a double-layered copper interconnect structure are used, with a variety of different formation methods. The copper interconnects might comprise two different conductive materials, a first of which is copper in some embodiments, and a second of which is not. The second conductive (non-copper) layer material can function as a barrier layer, which obviates the need for a barrier layer between two conductive materials. In some embodiments, the second conductive layer is cobalt (Co). Other materials that can be used for the second conductive layer include ruthenium (Ru), tungsten (W), molybdenum (Mo), gold (Au), silver (Ag), aluminum (Al), and various alloys thereof. In addition to copper (Cu), other materials can be used for the first conductive material, including copper alloys, cobalt (Co), ruthenium (Ru), tungsten (W), molybdenum (Mo), gold (Au), silver (Ag), aluminum (Al), and various alloys thereof.

With reference to FIG. 1, an exemplary embodiment of the disclosed barrier layer is presented. Exemplary semiconductor structure 200 includes a first conductive layer 210, a diffusion barrier layer 215, a second conductive layer 220 and via 225. In some embodiments, both first conductive layer 210 and via 225 are constructed from copper. In some embodiments, second conductive layer 220 is constructed from cobalt.

In some embodiments, the second conductive layer can operate as a diffusion barrier layer, obviating the need for a separate diffusion barrier layer 215. In other embodiments, various alloys can be used as diffusion barrier layer 215, including the following: tantalum nitride (TaN), titanium nitride (TiN), and cobalt tungsten phosphide (CoWP).

In some embodiments, there is a second barrier layer that can be one of a variety of different materials, including: tantalum nitride (TaN), titanium nitride (TiN), pyroxmangite (MnSiO$_3$), and tantalum manganese oxide (TaMnO).

With reference to FIGS. 2 through 8, pictorial representations that illustrate the formation of trench area and via holes according to various embodiments are presented.

Figure 2:
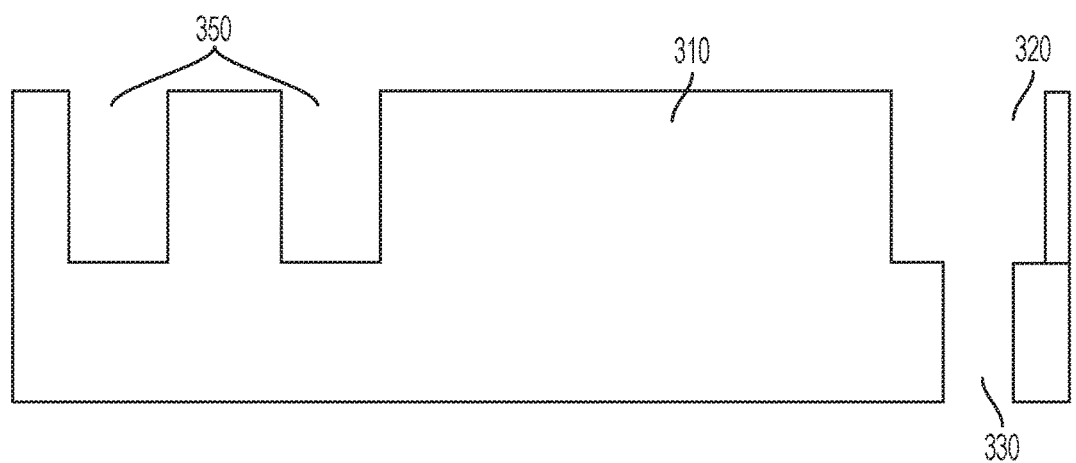
FIG. 2 is a pictorial representation that illustrates the formation of a trench area and an interconnect disposed therein according to various embodiments.

FIG. 2 shows a dielectric material 310. For illustrative purposes, trench 320 and via 330 are also shown. In the figures that follow, the process of forming a double layer barrier layer will be shown in trench 350.

Figure 3:
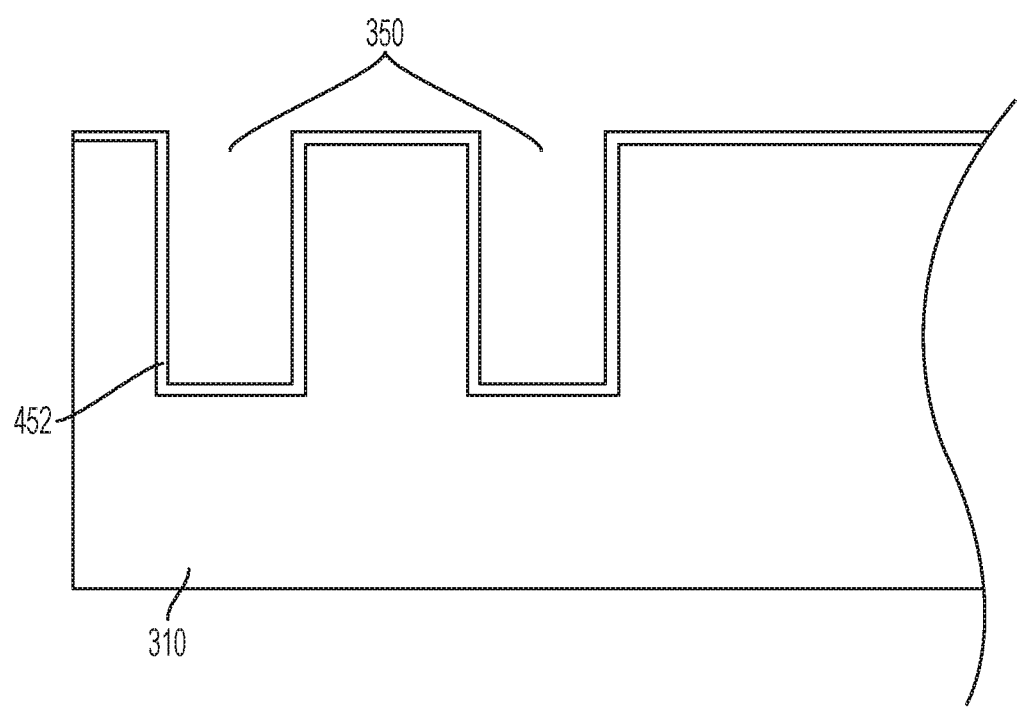
FIG. 3 is a pictorial representation that continues the illustration of the formation of a trench area and an interconnect disposed therein according to various embodiments.

FIG. 3 illustrates the formation of a layer on top of dielectric material 310, within trench 350. FIG. 3 is a continuation of FIG. 2, with the exception that the right-hand portion of FIG. 2 is not shown in FIG. 3. In some embodiments, trench 350 or other similar recess might need to be formed in dielectric 310. In other embodiments, trench 350 is previously formed in dielectric 310. A layer 452 is disposed on dielectric 310, within trench 350. In some embodiments, layer 452 might be 5 angstroms to 40 angstroms in thickness. In some embodiments, layer 452 is comprised of TaN and disposed via physical vapor deposition (PVD) or atomic layer deposition (ALD). In other embodiments, other deposition methods might be used. In other embodiments, layer 452 can comprise titanium nitriade (TiN), pyroxmangite (MnSiO$_3$), or tantalum manganese oxide (TaMnO). In some embodiments, layer 452 might be referred to as a diffusion layer.

Figure 4:
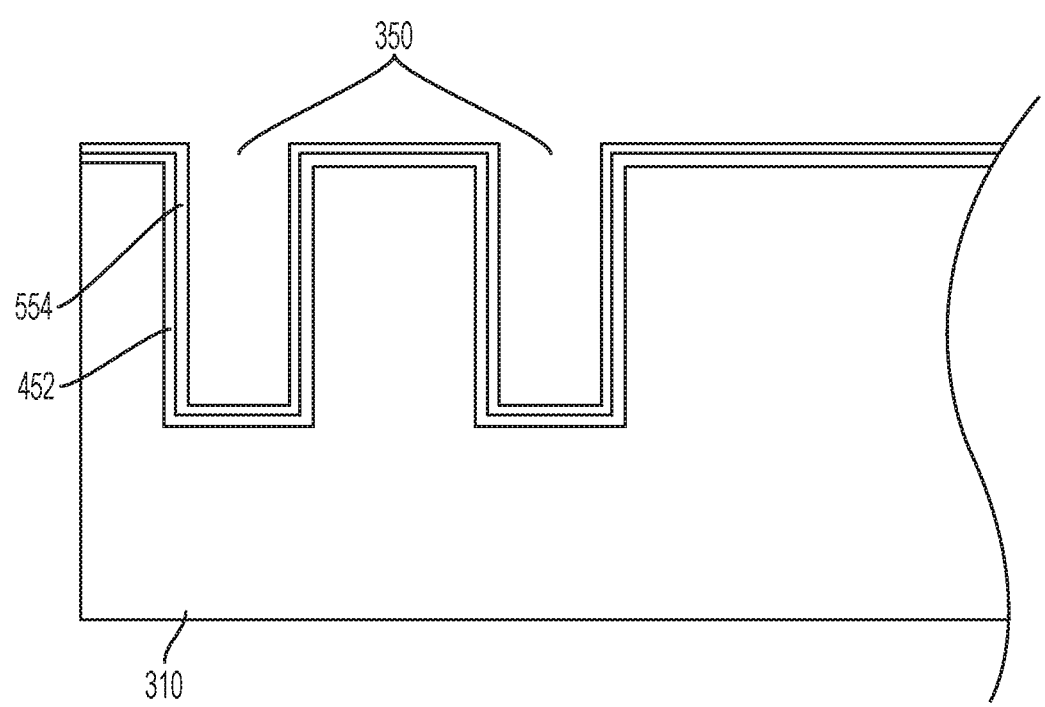
FIG. 4 is a pictorial representation that continues the illustration of the formation of a trench area and an interconnect disposed therein according to various embodiments.

FIG. 4 illustrates the formation of a next layer. In FIG. 4, a layer 554 of cobalt is disposed on layer 452. In some embodiments, layer 554 might serve as a wetting layer. In some embodiments, cobalt layer 554 might be between 5 and 40 angstroms in thickness.

Figure 5:
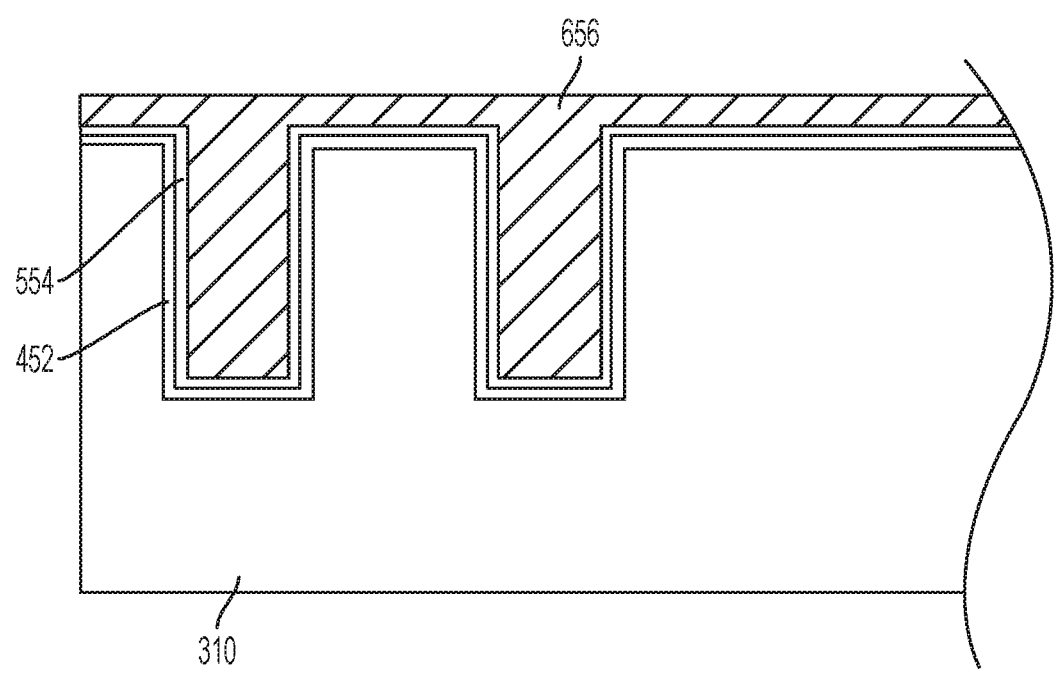
FIG. 5 is a pictorial representation that continues the illustration of the formation of a trench area and an interconnect disposed therein according to various embodiments.
Figure 6:
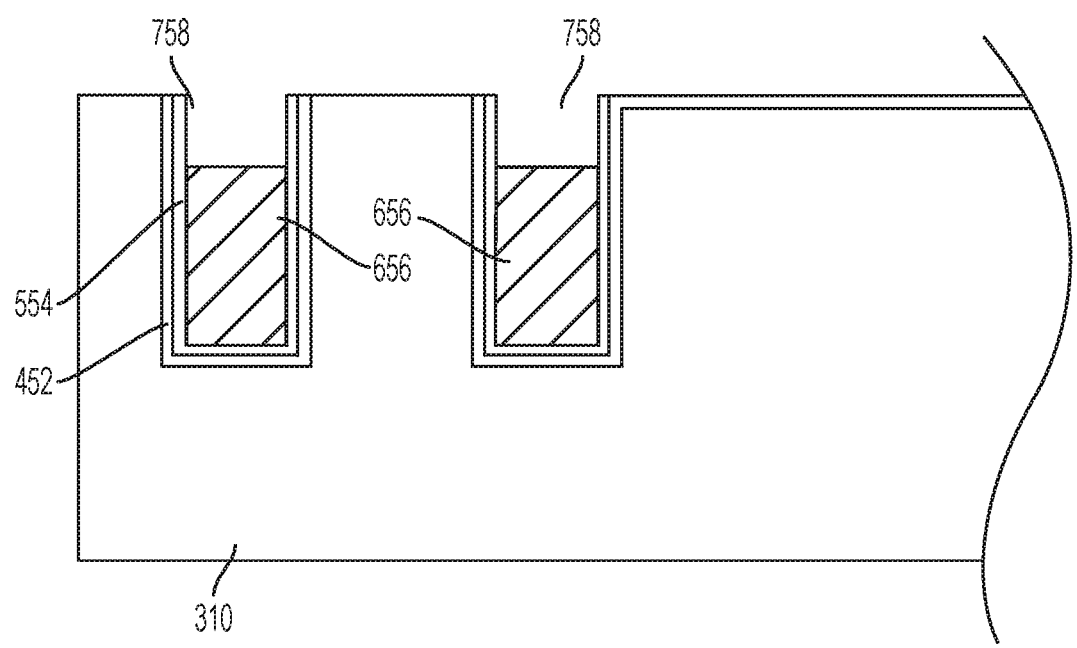
FIG. 6 is a pictorial representation that continues the illustration of the formation of a trench area and an interconnect disposed therein according to various embodiments.

FIG. 5 illustrates the formation of a next layer. Here, a first conductive layer 656 has been added to the construction of FIG. 4. In some embodiments, a copper-manganese seed and electroplating can be used for the deposition of first conductive layer 656. In some embodiments, first conductive layer 656 can be referred to as a copper gap fill layer. A variety of different methods can be used to depose first conductive layer 656. In some embodiments, a vacuum continuous deposition can be used. In some embodiments, a copper reflow can be used. Thereafter, a chemical mechanical planarization (CMP) process is performed to remove layers 452, 554, and 656 to a certain level in the field area (layer 452 will remain on the side wall, some of layer 554 might be attacked and may or may not be cleared completely on the side wall). The result is shown in FIG. 6. As shown in FIG. 6, there might be an overpolish such that a recess 758 is created.

Figure 7:
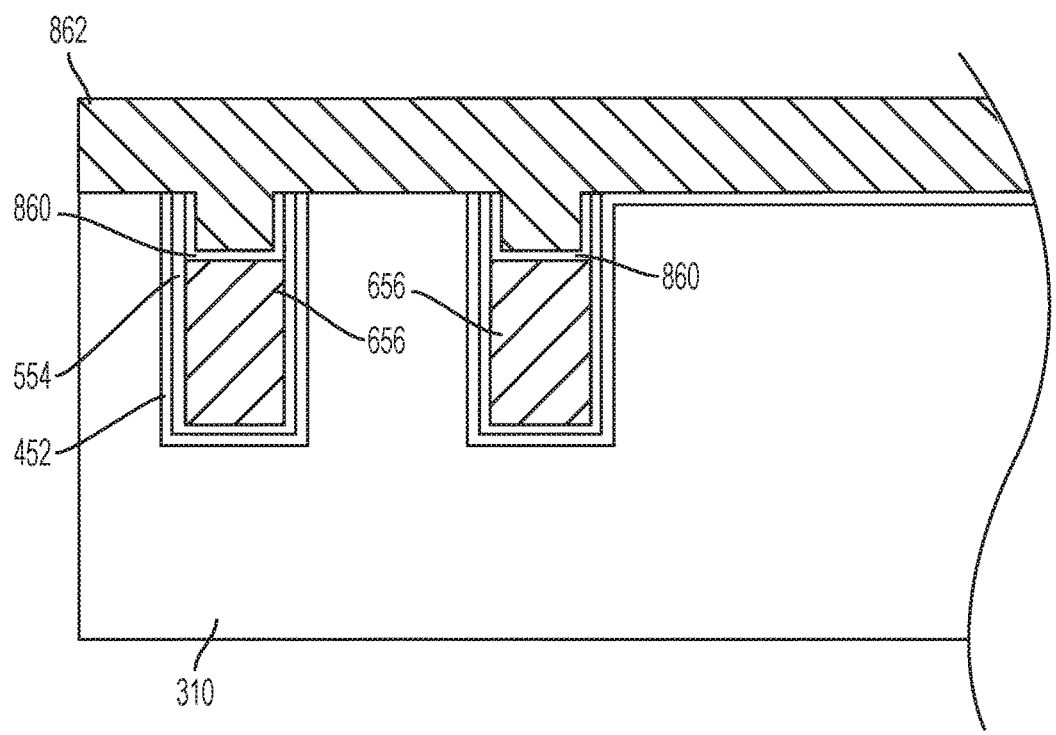
FIG. 7 is a pictorial representation that continues the illustration of the formation of a trench area and an interconnect disposed therein according to various embodiments.
Figure 8:
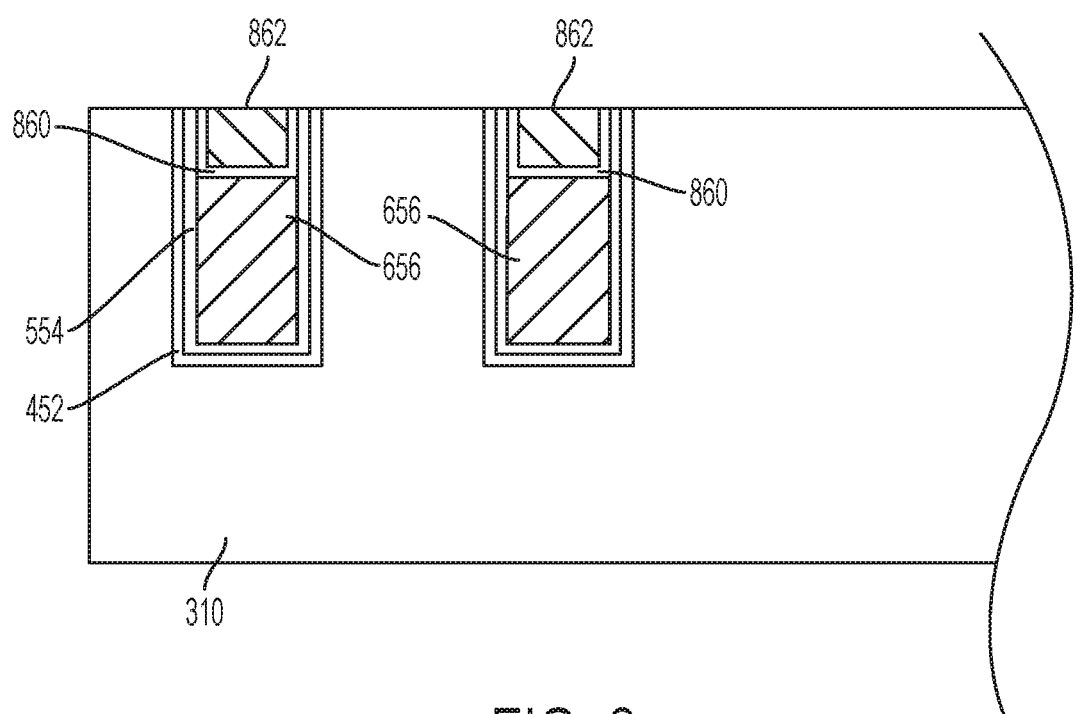
FIG. 8 is a pictorial representation that continues the illustration of the formation of a trench area and an interconnect disposed therein according to various embodiments.

In FIG. 7, a barrier layer 860 has deposited in recess 758. Atop barrier layer 860 is a second conductor layer 862. In some embodiments, second conductor layer 862 can comprise cobalt. In other embodiments, other conductors can be used for second conductor layer 862. These other conductors can include ruthenium (Ru), tungsten (W), molybdenum (Mo), gold (Au), silver (Ag), aluminum (Al), and various alloys thereof. In some embodiments, barrier layer 860 can comprise tantalum nitride (TaN), titanium nitride (TiN), and cobalt tungsten phosphide (CoWP). As described above, in some embodiments, barrier metal layer 860 might not be needed, depending on the composition of second conductor layer 862. Thereafter, a chemical mechanical planarization can be performed to finish the processing. The result is illustrated in FIG. 8.

The resulting structure has a relatively low via resistance while also providing a sufficient electromigration barrier. The via resistance is low because there is no high resistance layer at the bottom of the via. Electrons flow from another layer through the via to second conductor layer 862. Then the electron flow disperses in the second conductive layer into the first conductive layer 656 through barrier layer 860. Barrier layer 860 works as an electromigration blocking boundary to prevent copper atoms from the upper metal layer from flowing to first conductive layer 656 (and below). Barrier layer 860 is not at the bottom of the via, but is instead on the top surface of first conductive layer 656. Thus, the electrons have a large area the barrier level through which it can travel, lowering the resistance of the via compared to older technologies, while still providing a blocking of electromigration.

Barrier layer 860 also serves as an electromigration redundancy layer. When a copper interconnect causes disconnection due to electromigration, there is a bypass line which can still maintain the electron conductivity. The bypass line is sometimes called the electromigration redundancy layer. In embodiments disclosed herein, second conductive layer 862 can serve as the electromigration redundancy layer. Barrier layer 860 also serves to prevent cobalt diffusion (from second conductive layer 862 into copper (from first conductive layer 656).

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for forming a semiconductor interconnect structure comprising:
   forming a first conductive layer in a recess of a dielectric layer;
   forming a second conductive layer disposed on the first conductive layer; and
   forming a wetting layer with a thickness between approximately 5 angstroms and 40 angstroms between the first conductive layer and the dielectric; wherein
   the wetting layer comprises cobalt.

2. The method of claim 1 further comprising:
   forming a barrier layer disposed on the first conductive layer, wherein the barrier layer serves as a barrier to electromigration between the first conductive layer and the second conductive layer.

3. The method of claim 2 wherein:
   the barrier layer is formed from the second conductive layer.

4. The method of claim 2 wherein:
   the barrier layer is comprised of tantalum nitride.

5. The method of claim 4 wherein:
   the barrier layer is disposed on the first conductive layer via a physical vapor deposition or an atomic layer deposition.

6. The method of claim 2 wherein:
   the barrier layer is selected from the group consisting of tantalum nitride (TaN), titanium nitride (TiN), and cobalt tungsten phosphide (CoWP).

7. The method of claim 1 wherein:
   the first conductive layer comprises copper; and
   the second conductive layer comprises cobalt.

8. The method of claim 1 wherein:
   the first conductive layer is selected from the group consisting of cobalt (Co), ruthenium (Ru), tungsten (W), molybdenum (Mo), gold (Au), silver (Ag), aluminum (Al), and various alloys thereof; and
   the second conductive layer is selected from the group consisting of ruthenium (Ru), tungsten (W), molybdenum (Mo), gold (Au), silver (Ag), aluminum (Al), and various alloys thereof.

9. The method of claim 1 further comprising:
   forming a diffusion layer with a thickness between approximately 5 angstroms and 40 angstroms on the dielectric; wherein
   the first conductive layer is formed on the diffusion layer.

10. The method of claim 9 wherein:
    the diffusion layer is selected from the group consisting of tantalum nitride (TaN), titanium nitride (TiN), pyroxmangite ($MnSiO_3$), and tantalum manganese oxide (TaMnO).

11. The method of claim 1 further comprising:
    performing a chemical-mechanical planarization process before forming the second conductive layer on the first conductive layer.

12. The method of claim 11 wherein:
    the chemical-mechanical planarization process is configured to overpolish to form a recess.

13. The method of claim 1 further comprising:
    performing a chemical-mechanical planarization process after forming the second conductive layer on the first conductive layer.

\* \* \* \* \*